(12) United States Patent
Eguchi et al.

(10) Patent No.: US 11,569,192 B2
(45) Date of Patent: Jan. 31, 2023

(54) METHOD FOR PRODUCING STRUCTURE, AND STRUCTURE

(71) Applicants: SHINKAWA LTD., Tokyo (JP); TOHOKU UNIVERSITY, Miyagi (JP)

(72) Inventors: Yuji Eguchi, Tokyo (JP); Kohei Seyama, Tokyo (JP); Tomonori Nakamura, Tokyo (JP); Hiroshi Kikuchi, Tokyo (JP); Takehito Shimatsu, Miyagi (JP); Miyuki Uomoto, Miyagi (JP)

(73) Assignees: SHINKAWA LTD., Tokyo (JP); TOHOKU UNIVERSITY, Miyagi (JP)

( * ) Notice: Subject to any disclaimer, the term of this patent is extended or adjusted under 35 U.S.C. 154(b) by 8 days.

(21) Appl. No.: 16/615,816

(22) PCT Filed: May 24, 2018

(86) PCT No.: PCT/JP2018/019972
§ 371 (c)(1),
(2) Date: Nov. 22, 2019

(87) PCT Pub. No.: WO2018/216763
PCT Pub. Date: Nov. 29, 2018

(65) Prior Publication Data
US 2020/0083190 A1 Mar. 12, 2020

(30) Foreign Application Priority Data
May 25, 2017 (JP) .............................. JP2017-103175

(51) Int. Cl.
*H01L 23/00* (2006.01)
(52) U.S. Cl.
CPC .............. *H01L 24/27* (2013.01); *H01L 24/30* (2013.01); *H01L 24/32* (2013.01); *H01L 24/83* (2013.01);
(Continued)

(58) Field of Classification Search
CPC ......... H01L 24/27; H01L 24/30; H01L 24/32; H01L 24/08; H01L 2224/27416;
(Continued)

(56) References Cited

U.S. PATENT DOCUMENTS

| 4,646,266 A | * | 2/1987 | Ovshinsky | ............ H01L 27/118 365/105 |
| 5,786,271 A | * | 7/1998 | Ohida | ..................... H01L 24/13 257/E23.125 |

(Continued)

FOREIGN PATENT DOCUMENTS

| CN | 101431319 | 5/2009 |
| CN | 102100132 | 6/2011 |

(Continued)

OTHER PUBLICATIONS

"International Search Report (Form PCT/ISA/210)" of PCT/JP2018/019972, dated Jul. 17, 2018, with English translation thereof, pp. 1-2.

(Continued)

*Primary Examiner* — Dale E Page
*Assistant Examiner* — Quovaunda Jefferson
(74) *Attorney, Agent, or Firm* — JCIPRNET (57) ABSTRACT

This method for producing a structure wherein base materials are bonded by atomic diffusion comprises: a step for applying a liquid resin on the base material; a step for smoothing the surface of the liquid resin by surface tension; a step for forming a resin layer by curing; a step for forming a metal thin film on the resin layer; a step for forming a metal thin film on the base material; and a step for bringing the metal thin film of the base material and the metal thin film of the base material into close contact with each other,
(Continued)

thereby bonding the metal thin film of the resin layer and the metal thin film of the base material with each other by atomic diffusion.

18 Claims, 9 Drawing Sheets

(52) U.S. Cl.
CPC .............. *H01L 2224/27416* (2013.01); *H01L 2224/30505* (2013.01); *H01L 2224/32145* (2013.01); *H01L 2224/8383* (2013.01)

(58) Field of Classification Search
CPC . H01L 2224/30505; H01L 2224/32145; H01L 2224/8383
See application file for complete search history.

(56) References Cited

U.S. PATENT DOCUMENTS

| | | | | |
|---|---|---|---|---|
| 6,333,206 | B1* | 12/2001 | Ito | C08L 63/00 |
| | | | | 438/106 |
| 7,863,529 | B2* | 1/2011 | Hashimoto | H03H 9/1021 |
| | | | | 174/560 |
| 2002/0123228 | A1* | 9/2002 | Smoak | H01L 24/03 |
| | | | | 438/706 |
| 2004/0157407 | A1 | 8/2004 | Tong et al. | |
| 2004/0201096 | A1* | 10/2004 | Iijima | H05K 1/115 |
| | | | | 257/734 |
| 2012/0013021 | A1* | 1/2012 | Kobayashi | H01L 24/19 |
| | | | | 257/E21.597 |
| 2012/0305298 | A1 | 12/2012 | Uang et al. | |
| 2013/0252399 | A1 | 9/2013 | Leduc | |

FOREIGN PATENT DOCUMENTS

| | | |
|---|---|---|
| CN | 102285625 | 12/2011 |
| CN | 102291099 | 12/2011 |
| EP | 0570224 | 11/1993 |
| JP | 2008207221 | 9/2008 |
| JP | 2013168503 | 8/2013 |
| JP | 2015106677 | 6/2015 |
| JP | 2016207924 | 12/2016 |

OTHER PUBLICATIONS

"International Preliminary Report of Patentability (Form PCT/IB/373) of PCT/JP2018/019972", with English translation thereof, dated Nov. 26, 2019, pp. 1-10.
Office Action of Korean Counterpart Application, with English translation thereof, dated Oct. 15, 2021, pp. 1-9.
Office Action of Korean Counterpart Application, with English translation thereof, dated Nov. 29, 2021, pp. 1-11.
"Search Report of Europe Counterpart Application", dated Feb. 3, 2021, p. 1-p. 11.
"Office Action of Korea Counterpart Application", dated Apr. 6, 2021, with English translation thereof, p. 1-p. 12.
"Office Action of China Counterpart Application", dated Aug. 22, 2022, with English translation thereof, pp. 1-19.

* cited by examiner

METHOD FOR PRODUCING STRUCTURE, AND STRUCTURE

CROSS-REFERENCE TO RELATED APPLICATION

This application is a 371 application of the international PCT application serial no. PCT/JP2018/019972, filed on May 24, 2018, which claims priority benefits of Japanese Patent Application no. 2017-103175, filed on May 25, 2017. The entirety of each of the above-mentioned patent applications is hereby incorporated by reference herein and made a part of this specification.

TECHNICAL FIELD

The present disclosure relates to a structure manufacturing method and a manufactured structure, in particular to a structure manufacturing method using an atomic diffusion bonding method, and a structure manufactured by the atomic diffusion bonding method.

BACKGROUND

A structure may be manufactured by bonding multiple elements. For example, a semiconductor assembly may be manufactured by bonding (laminating) semiconductor devices and substrates. Patent Literature 1 discloses a bonding method by forming a resin layer over a surface of a substrate to cover electrodes on the surface of the substrate and bonding semiconductor devices to the electrodes on the substrate while melting the resin layer. This manufacturing method can reduce contaminants entering between the electrodes and the semiconductor devices on the substrate.

Recently, besides the above described bonding method, an atomic diffusion bonding method for elements are known. In the atomic diffusion bonding method, a metal thin film is formed on each of a pair of facing surfaces of elements. The elements are bonded by tightly attaching the metal thin films together to cause atomic diffusion. Because the atomic diffusion bonding method can be performed at room temperature, the bonding is possible without applying heat to the elements, and is applicable to elements of different materials having different coefficients of thermal expansion. Further, because the bonding is achieved at an atomic level, no adhesive agent is required. The atomic diffusion bonding method is excellent in bonding strength, reliability, and durability.

CITATION LIST

Patent Literature

Patent Literature 1: JP 2013-168503 A

SUMMARY

Technical Problem

In the atomic diffusion bonding method, because elements are bonded via metal thin films formed on surfaces of the elements, it is necessary to tightly attach the metal thin films together. Accordingly, thin film forming surfaces on which the metal thin films are to be formed need to be smooth.

When the thin film forming surfaces of the elements are not smooth, for example, when the thin film forming surfaces are rough, a process such as a polishing process to polish the surfaces (thin film forming surfaces) of the elements is necessary to make the thin film forming surfaces of the elements smooth. This polishing process is complex, increasing the cost. When contaminants exist between the metal thin films of the elements to be bonded, tight attachment between the metal thin films of the elements becomes unlikely, making bonding using the atomic diffusion difficult.

The present disclosure enables atomic diffusion bonding even when thin film forming surfaces of elements are not smooth, or even when a contaminant exists between the metal thin films of the elements.

Solution to Problem

A manufacturing method of a structure according to the present disclosure is a manufacturing method of a structure in which multiple elements are bonded using atomic diffusion. The method includes applying a liquid resin to a surface of at least one of the elements, and smoothing a surface of the liquid resin using surface tension of the applied liquid resin. The method also includes forming a resin layer by curing the liquid resin, forming a metal thin film on a surface of the resin layer, and forming another metal thin film on a surface of another element. The method further includes tightly attaching and bonding the metal thin film of the at least one element and the metal thin film of the other element.

Another manufacturing method of a structure according to the present disclosure is a manufacturing method of a structure in which multiple elements are bonded using atomic diffusion, and the method includes applying a liquid resin to surfaces of the multiple elements and smoothing surfaces of the liquid resin using surface tension of the applied liquid resin. The method also includes forming resin layers by curing the liquid resin, forming a metal thin film on a surface of each of the resin layers, and tightly attaching and bonding the metal thin films of the multiple elements to one another.

In the manufacturing method of the structure according to the present disclosure, the resin layers may have elasticity, and the multiple elements may be semiconductors.

In the manufacturing method of the structure according to the present disclosure, at least one of the semiconductors may include multiple electrodes that protrude from a surface of the at least one semiconductor for a predetermined length, and the liquid resin may be applied between the electrodes. The surface of the liquid resin may be smoothed by surface tension of the liquid resin such that distal end surfaces of the multiple electrodes and the surface of the liquid resin are in the same plane.

In the manufacturing method of the structure according to the present disclosure, the elements may be semiconductor chips that form semiconductors. The liquid resin may be applied to a front surface and/or a back surface of each of the semiconductor chips. The applied liquid resin may be smoothed to have a surface roughness lower than that of the other element.

A structure according to the present disclosure is a structure in which metal thin films are formed on respective surfaces of multiple elements such that the multiple elements are bonded via the metal thin films. The structure further comprises a resin layer disposed between at least one of the multiple elements and the metal thin film, and a surface of the resin layer is smoothed. The resin layer has elasticity.

In the structure according to the present disclosure, the at least one element may be a semiconductor chip, and the resin layer may have a surface roughness lower than that of the other element to be bonded.

Advantageous Effects of Invention

According to the present disclosure, even when a thin film faying surface of an element is not smooth, because a smooth thin film faying surface can be formed in a simple method, bonding using atomic diffusion is possible. Further, even when a contaminant exists between metal thin films of the elements, bonding using atomic diffusion is possible.

DESCRIPTION OF EMBODIMENTS

Figure 1:
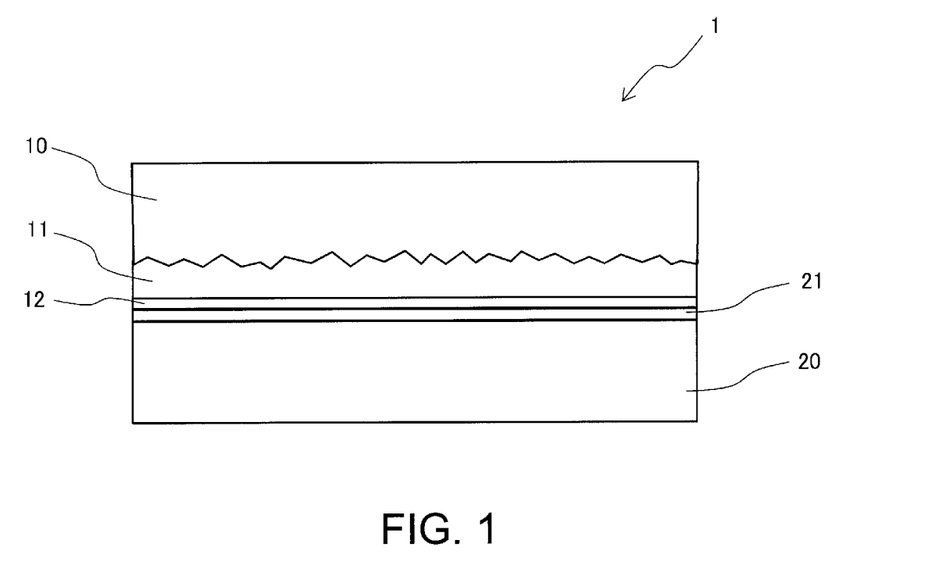
FIG. 1 is a schematic configuration diagram of a structure according to a first embodiment.

Initially, a first embodiment will be described by reference to FIGS. 1 to 3B. As shown in FIG. 1, a structure 1 according to the first embodiment is formed by bonding a pair of elements, base components 10, 20, using an atomic diffusion bonding method. It should be noted that although the structure 1 including a single pair of base components 10, 20 is described below, the number of the pair of base components 10, 20 may also be two or more.

The structure 1 includes the base component 10 on one side, a resin layer 11 disposed on a faying surface of the base component 10; a metal thin film 12 disposed on a surface of the resin layer 11; the base component 20 on the other side; and a metal thin film 21 disposed on a faying surface of the base component 20. The base component 20 is an element to which the base component 10 is bonded.

The faying surface of the base component 10 is a rough surface. As a material for the base components 10, 20, besides various metals and alloys, a semiconductor substrate such as a silicon (Si) substrate, glass, ceramics, and resin can be used. The bonding between base components 10, 20 are not limited to bonding between the same materials such as between metal material components. The bonding may be between different materials, for example, between a metal component and a ceramic component, or between an integrated circuit (IC) chip and an Si substrate. The shapes of the base components 10, 20 are not limited. The base components 10, 20 may have planer shapes or complicated three-dimensional shapes. The base component 10 may be, for example, a semiconductor chip that forms a semiconductor. The base component 20 may be an Si substrate (silicon substrate) or a semiconductor chip, each of which forms a semiconductor.

The resin layer 11 is formed to have a predetermined thickness on the faying surface of the base component 10. The resin layer 11 is formed by spin coating a liquid resin on the faying surface of the base component 10 and curing the liquid resin. The resin layer 11 needs to be selected from resins having characteristics of good bonding compatibility with the metal thin film 12. For example, a resin, such as a silicone resin, a fluorine resin, a polyimide resin, an acrylic resin, or an epoxy resin may be used.

The metal thin film 12 having a film thickness of several nm to several hundred nm is formed on the surface of the resin layer 11 by a sputtering film forming method. The metal thin film 21 having a film thickness of several nm to 10 nm is formed on the surface of the base component 20 by a similar film forming method. Besides the sputtering, a film forming method, such as physical vapor deposition (PVD), chemical vapor deposition (CVD), or vacuum deposition, may be used. As a material for the metal thin films 12, 21, metal, such as gold (Au) and silver (Ag), may be used.

Figure 2:
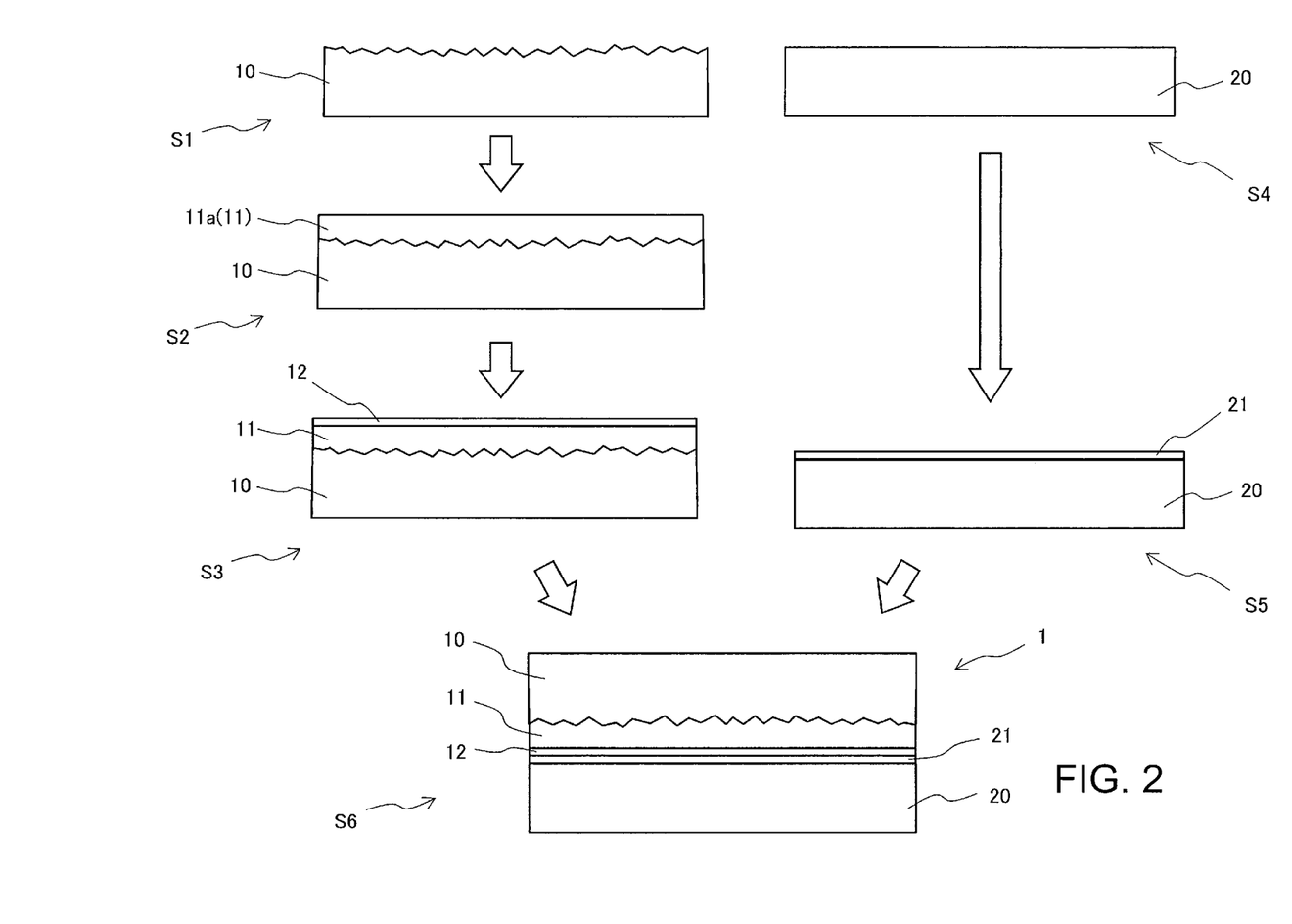
FIG. 2 is a manufacturing process diagram of the structure according to the first embodiment.

Next, a manufacturing method of the structure 1 will be described by reference to FIG. 2. First, in step S1 in FIG. 2, the base component 10 is prepared. The faying surface of the base component 10 is rough. Although a polishing process to smooth the rough surface is required when the faying surface is rough, as in this case, no polishing process is performed in the first embodiment and the surface in a rough state is used.

In step S2, a liquid resin 11a is applied on the rough surface of the base component 10. The applied liquid resin 11a fills the rough surface and the surface of the liquid resin 11a is smoothed by surface tension of the liquid resin 11a. Specifically, immediately after the application, the surface tension acts on the liquid resin 11a to smooth the surface of the liquid resin 11a. After it is confirmed that the surface of the liquid resin 11a is smoothed, the base component 10 and the liquid resin 11a are heated and the liquid resin 11a is cured to form the resin layer 11.

In step S3, the base component 10 with the resin layer 11 formed thereon is disposed inside a vacuum enclosure. The metal thin film 12 is formed by sputtering on the surface of the resin layer 11.

Meanwhile, in step S4, the base component 20 is prepared. In step S5, the base component 20 is disposed inside a vacuum enclosure. The metal thin film 21 is formed by sputtering on the surface of the base component 20. Because no smoothing of the surface is required for the surface of the base component 20 that is not a rough surface like that of the base component 10, a liquid resin application, like the one for the base component 10, is not performed.

In step S6, the base components 10, 20 are respectively taken out of the vacuum enclosures. The base component 10 is turned over to direct the surface with the metal thin film 12 downwards, and the metal thin film 12 is superposed on the metal thin film 21 of the base component 20. In such a superposed state, a load is applied to the base component 10 so that the metal thin film 12 of the base component 10 and the metal thin film 21 of the base component 20 are tightly attached together. This tight attachment bonds the metal thin films 12, 21 together by atomic diffusion. The metal thin films 12, 21 are tightly bonded by the atomic diffusion bonding in which the metal thin films 12, 21 are in metal bonding or are intermolecularly bonded at an atomic level. The structure 1 is formed by the tight bonding of the metal thin films 12, 21.

In comparing a surface Ra (the arithmetic average of the roughness) of the base component 10 with a surface Ra of the resin layer 11, the surface Ra of the resin layer 11 is lower than the surface Ra of the base component 10. In other words, because the surface of the resin layer 11 is smoothed, the surface Ra is low, whereas because the surface is rough, the surface Ra of the base component 10 is high. This results in a relationship of the surface Ra of the resin layer 11<the surface Ra of the base component 10. Smoothing of the resin layer 11 makes the surface Ra of the resin layer 11 lower than the surface Ra of the base component 20 that has a smooth surface and does not require the smoothing of the surface.

Figure 3A:
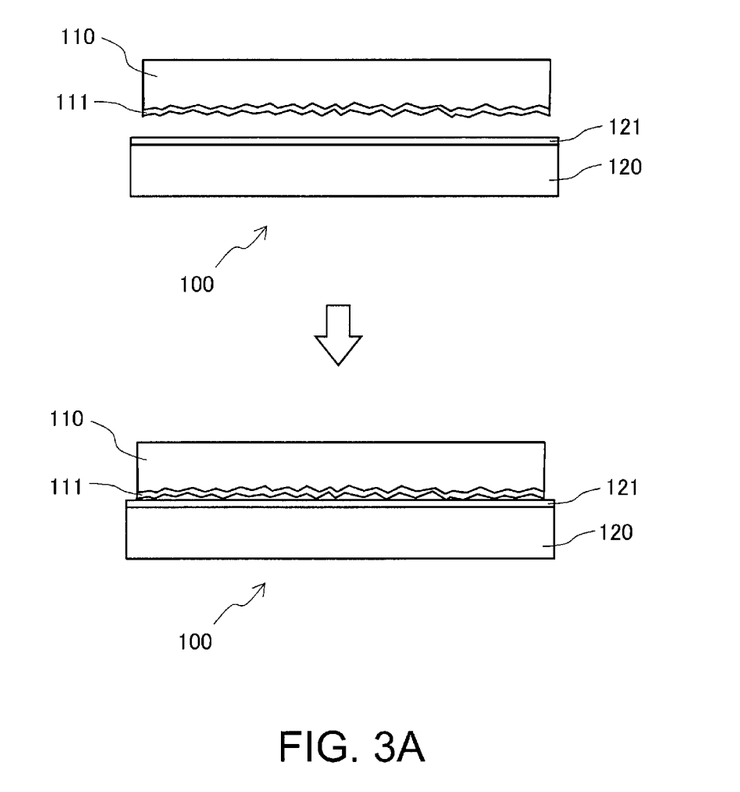
FIG. 3A is a schematic diagram showing a conventional structure with a rough substrate surface.
Figure 3B:
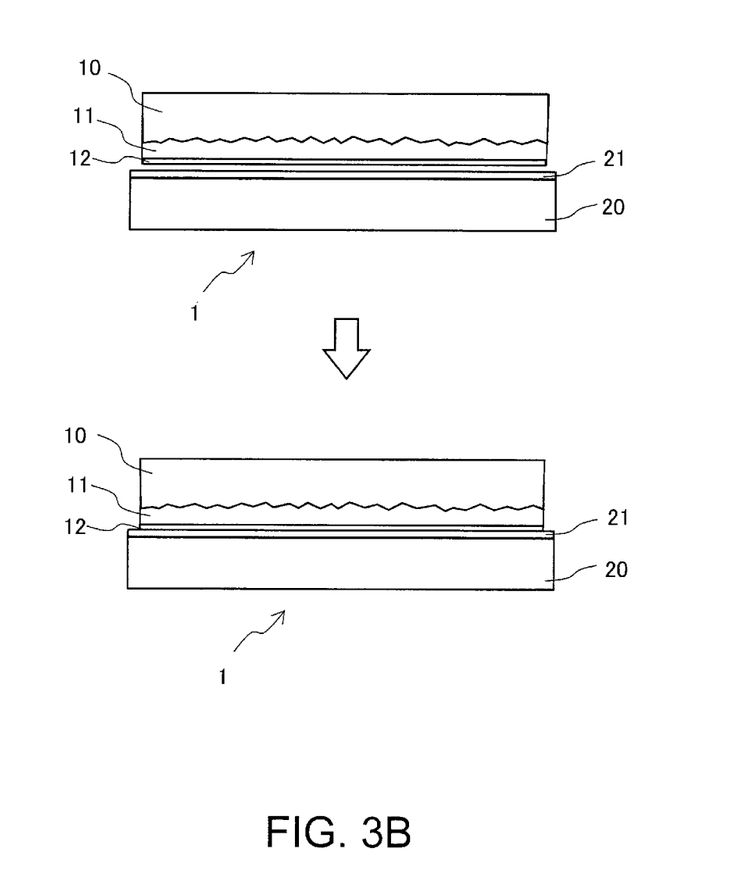
FIG. 3B is a schematic diagram of the structure according to the first embodiment with a rough substrate surface.

With reference to FIGS. 3A, 3B, advantages of the structure 1 will be described. FIGS. 3A, 3B are schematic diagrams in which base components with a rough faying surface are bonded using the atomic diffusion. FIG. 3A shows a conventional structure 100, whereas FIG. 3B shows the structure 1 according to the first embodiment.

With reference to FIG. 3A, the configuration of the conventional structure 100 will be briefly described. The structure 100 includes a base component 110 that has a rough faying surface; a metal thin film 111 formed on the rough faying surface of the base component 110; a base component 120, and a metal thin film 121 formed on a surface of the base component 120. The structure 100 is formed by superposing and bonding the metal thin films 111, 121 using atomic diffusion.

In the structure 100, because of the low smoothness of the rough surface of the base component 110, the surface of the metal thin film 111 formed on this rough surface also has a low smoothness. Accordingly, it becomes difficult to tightly attach and bond the metal thin films 111, 121 using atomic diffusion. This may cause a bonding failure.

In contrast, as shown in FIG. 3B, because the structure 1 has the resin layer 11 that fills the rough surface of the base component 10 and the surface of the resin layer 11 is a smooth surface, the surface of the metal thin film 12 is also smooth. Thus, the metal thin films 12, 21 can be tightly attached and bonded together using atomic diffusing.

As described above, because no polishing process is required to smooth the rough surface of the base component 10, cost can be reduced by omitting polishing procedures. Further, because the atomic diffusion bonding is possible even with a rough surface of the base component 10, the applicable range of the bondable materials by atomic diffusion can be extended.

When the surface of the base component 20 on which the metal thin film 21 is to be formed is rough, the resin layer 11 may be formed between the base component 20 and the metal thin film 21. In this case, in FIG. 2, a step similar to step S2 is performed between steps S4 and S5.

Figure 4:
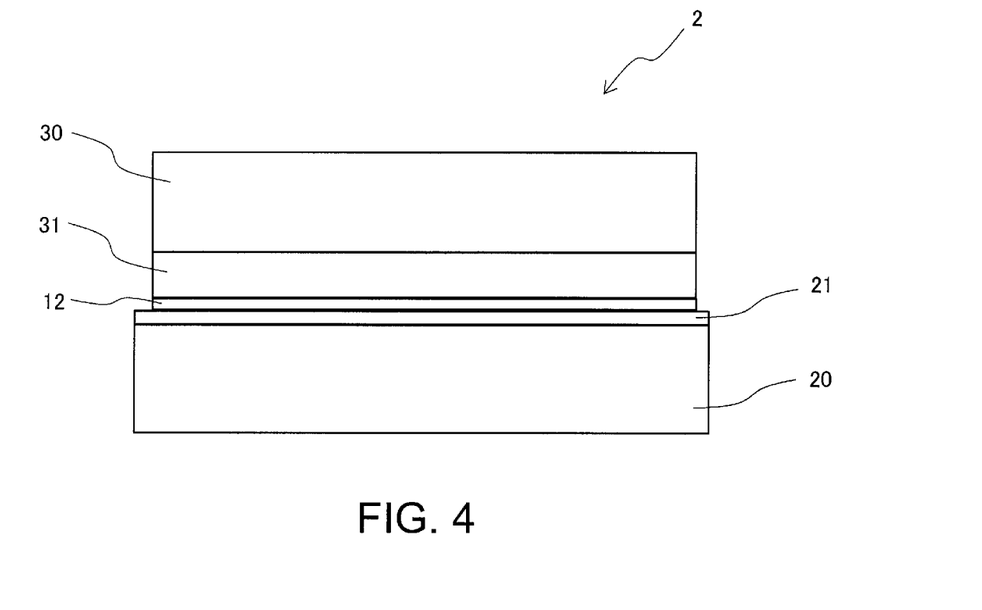
FIG. 4 is a schematic diagram of a structure according to a second embodiment.

Next, a second embodiment will be described by reference to FIGS. 4 to 6B. In the second embodiment, a faying surface of a base component 30 of a structure 2 is smooth. A resin layer 31 has characteristics that differ from those of the resin layer 11. Other configurations are identical to those of the structure 1 in the first embodiment. In FIG. 4, elements that are similar to those in FIG. 1 are assigned the same reference numerals and their descriptions are omitted.

The resin layer 31 of a predetermined thickness is formed on the faying surface (smooth surface) of the base component 30. The resin layer 31 is formed by spin coating a liquid resin on the faying surface of the base component 30 and curing the liquid resin. The resin layer 31 needs to be selected from resins having characteristics of good bonding compatibility with the metal thin film 12 and elasticity after curing. As an example of such a resin, a silicone resin, a fluorine resin, a polyimide resin, acrylic resin, and an epoxy resin may be used.

Figure 5:
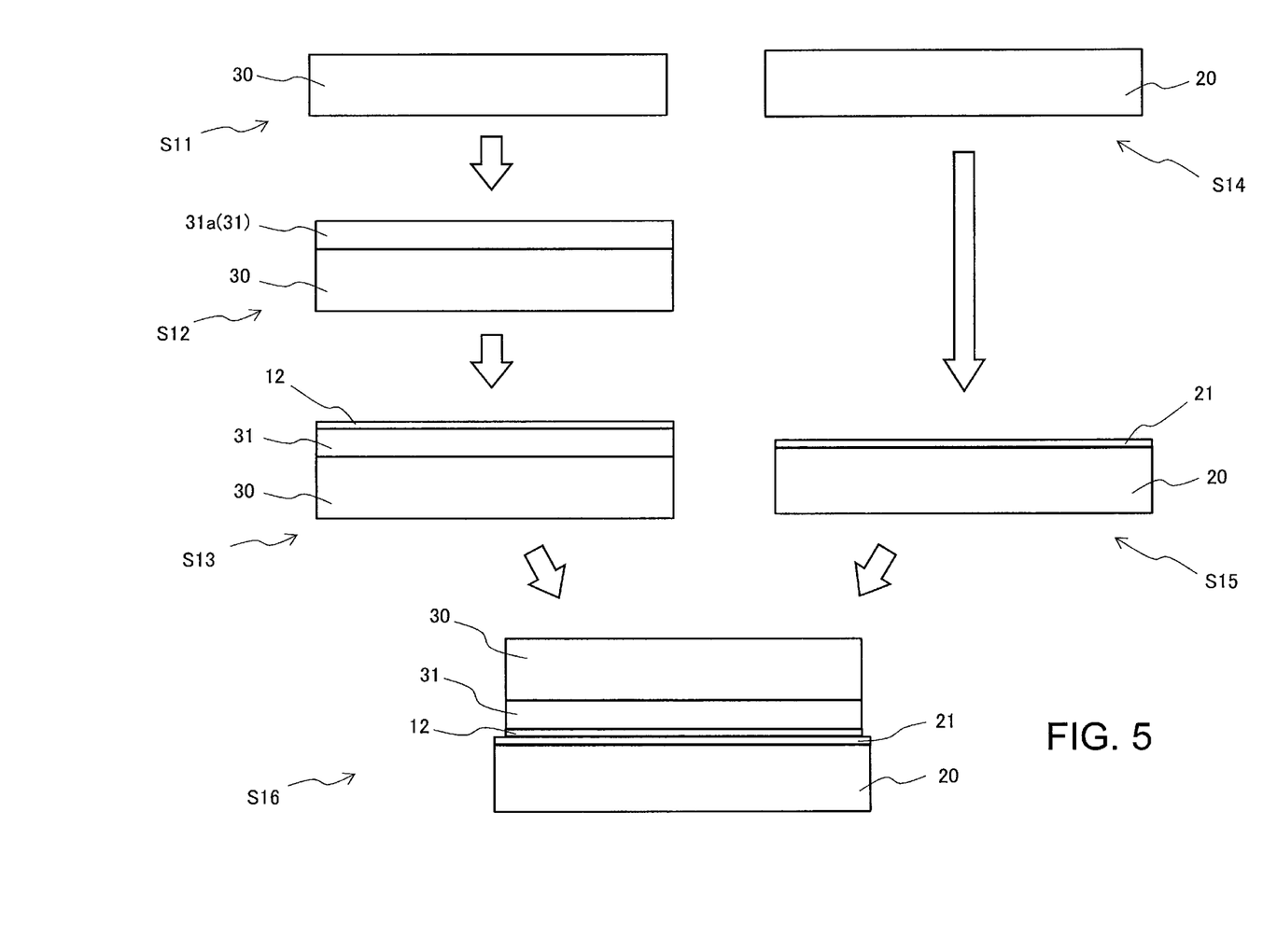
FIG. 5 is a manufacturing process diagram of the structure according to the second embodiment.

With reference to FIG. 5, manufacturing of the structure 2 will be described. In step S11 in FIG. 5, the base component 30 is prepared.

In step S12, a liquid resin 31a is applied on a faying surface of the base component 30. As the material for the liquid resin 31a, a resin material having elasticity after curing is used. The surface of the applied liquid resin 31a becomes smooth because of surface tension of the liquid resin 31a. After the surface of the liquid resin 31a has been smoothed, the base component 30 and the liquid resin 31a are heated, and the liquid resin 31a is cured to form the resin layer 31. The resin layer 31 has elasticity after curing.

In step S13, the base component 30 with the resin layer 31 formed thereon is disposed inside a vacuum enclosure. The metal thin film 12 is formed by sputtering on the surface of the resin layer 31.

In steps S14, S15, the metal thin film 21 is formed on the base component 20, similarly to as in steps S4, S5. Subsequently, in S16, the base component 30 is turned over to direct the surface with the metal thin film 12 downwards, and the metal thin film 12 is superposed on the metal thin film 21 of the base component 20. In such a superposed state, a load is applied to the base component 30 so that the metal thin film 12 of the base component 30 and the metal thin film 21 of the base component 20 are tightly attached together. This tight attachment bonds the metal thin films 12, 21 together by atomic diffusion. The metal thin films 12, 21 are tightly bonded by the atomic diffusion in which the metal thin films 12, 21 are in metal bonding, or are bonded at an atomic or intermolecular level. The structure 2 is formed by the tight bonding of the metal thin films 12, 21.

Figure 6A:
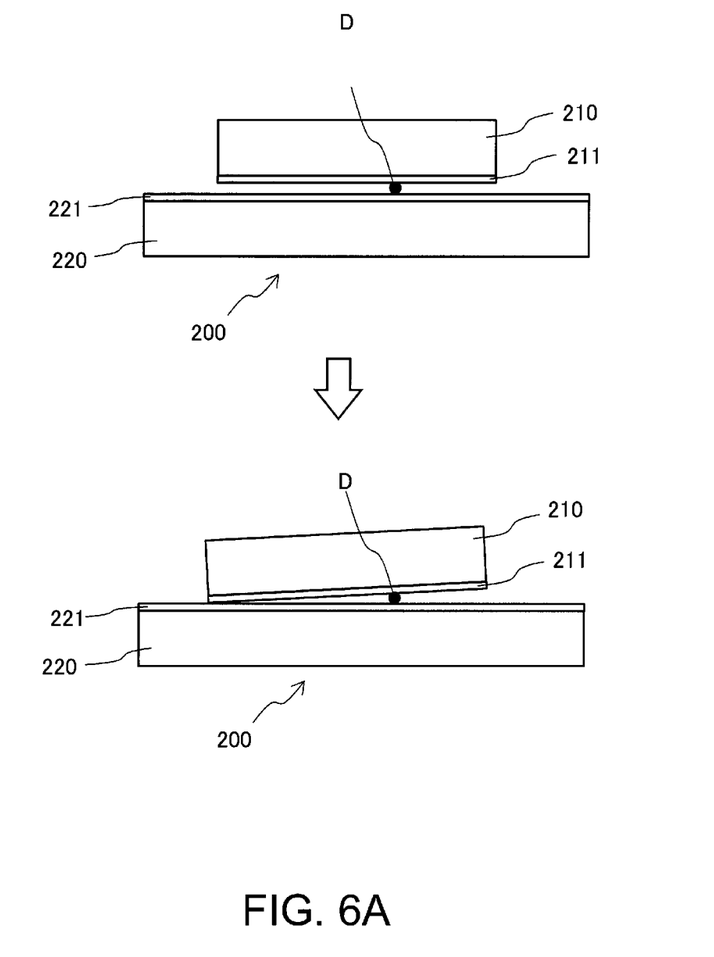
FIG. 6A is a schematic diagram showing a conventional structure when a contaminant has entered between metal thin films.
Figure 6B:
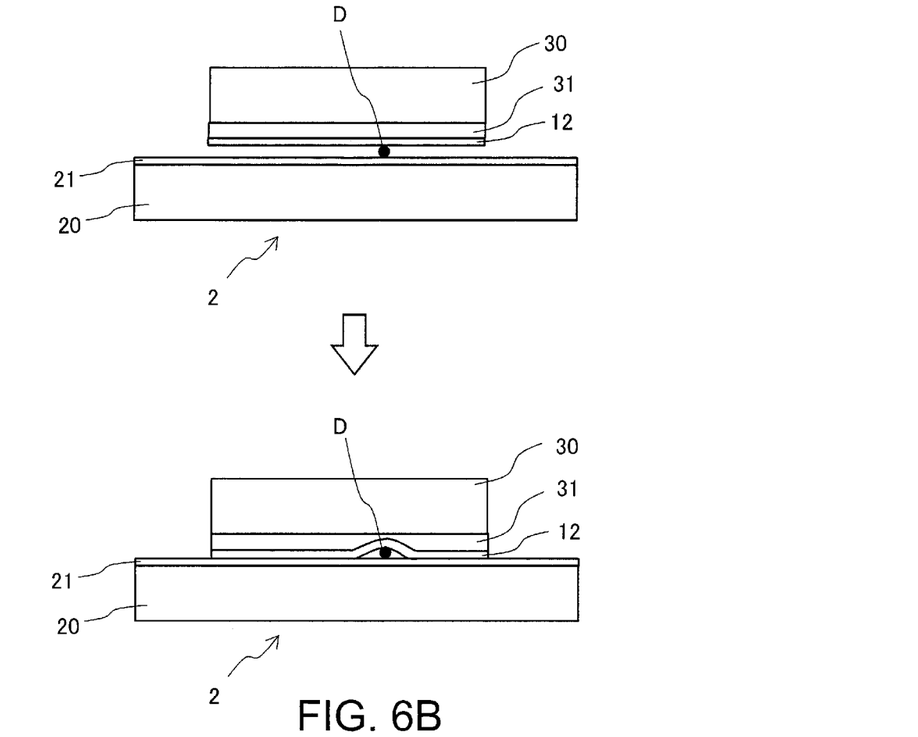
FIG. 6B is a schematic diagram of the structure according to the second embodiment when a contaminant has entered between the metal thin films.

Advantages of the structure 2 will be described with reference to FIGS. 6A, 6B. FIGS. 6A, 6B are schematic diagrams which are used to describe cases where a contaminant D has entered between the metal thin films. FIG. 6A shows a conventional structure 200, while FIG. 6B shows the structure 2 according to the second embodiment.

In FIG. 6A, the conventional structure 200 includes a base component 210, a metal thin film 211 formed on a surface of the base component 210, a base component 220, and a metal thin film 221 formed on a surface of the base component 220. The structure 200 is formed by superposing and bonding the metal thin films 211, 221 using atomic diffusion.

In the structure 200, when the contaminant D has entered between the metal thin films 211, 221 while superposing the metal thin films 211, 221, it becomes difficult to tightly superpose and attach the metal thin films 211, 221 because of the contaminant D acting as an obstacle. It therefore becomes difficult to bond the metal thin films 211, 221 using atomic diffusion. This may cause a bonding failure.

In contrast, as shown in FIG. 6B, in the structure 2 according to the second embodiment, the resin layer 31 elastically deforms in accordance with the shape of the contaminant D when the metal thin films 12, 21 are superposed together with the contaminant D having entered there between. With the contaminant D being enclosed, the metal thin films 12, 21 are tightly attached together. Specifically, the metal thin films 12, 21 are tightly attached together except for the area with the contaminant D.

The structure 2 can be obtained even when the contaminant D has entered, because the area excluding the contaminant D has a sufficient overlapping area to enable bonding of the metal thin films 12, 21 using the atomic diffusion.

Further, even when the surfaces of the metal thin films 12, 21 have a low smoothness, the metal thin films 12, 21 can be bonded using the atomic diffusion because the resin layer 31 can elastically deform to enable tight attachment of the metal thin films 12, 21.

Figure 7:
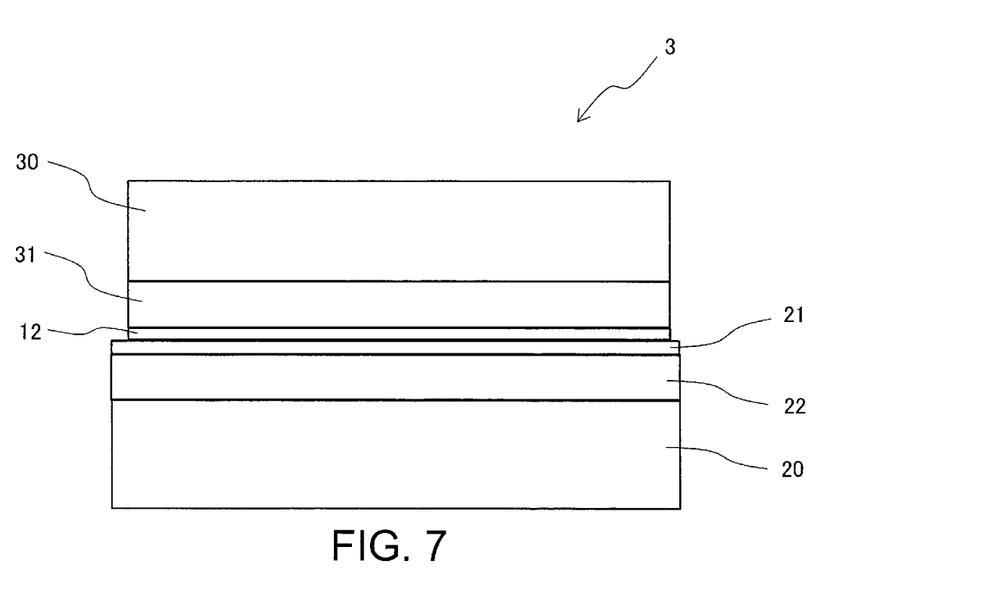
FIG. 7 is a schematic configuration diagram of a variation of the structure according to the second embodiment.

Next, variations of the second embodiment will described by reference to FIG. 7. As shown in FIG. 7, in a structure 3 that shows a variation of the second embodiment, a resin layer 22 is formed on the other base component 20. Specifically, the resin layer 22 is formed on a faying surface of the base component 20. As a material for the resin layer 22, a material that has elasticity after curing is used, similarly as for the resin layer 31.

As described above, by forming the resin layers 31, 22 on both of the base components 30, 20, the resin layers 31, 22 elastically deform in accordance with the shape of the contaminant D when the contaminant D has entered between the metal thin films 12, 21. Similarly to the second embodiment, the metal thin films 12, 21 can be bonded using the atomic diffusion because the metal thin films 12, 21 are tightly attached together even with the contaminant D sandwiched therebetween.

Further, because the elastically deformable amount is increased by the resin layers 31, 22, it becomes possible to accommodate a larger contaminant D and improve correspondence between the surfaces of the metal thin films 12, 21, enhancing the tight attachment between the metal thin films 12, 21.

Figure 8:
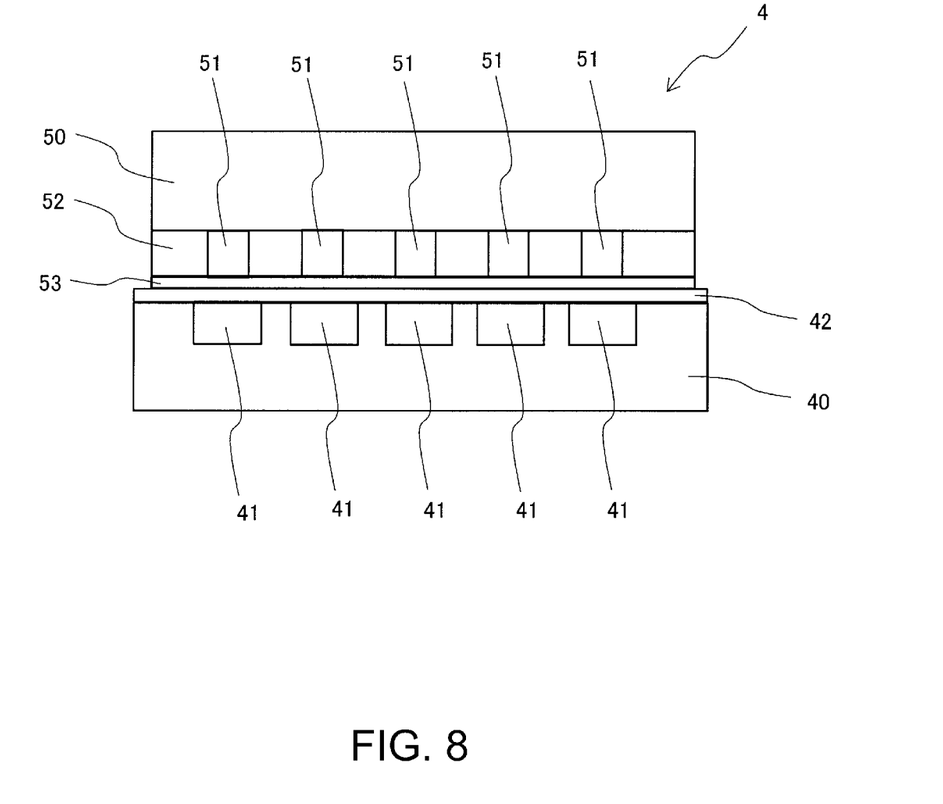
FIG. 8 is a schematic configuration diagram of a structure according to a third embodiment.

Next, a third embodiment will be described with reference to FIG. 8. In the third embodiment, the structure is a semiconductor assembly 4. As shown in FIG. 8, the semiconductor assembly 4 includes a base component 40, a chip component 50, a resin layer 52 which is provided between electrodes 51 of the chip component 50, and metal thin films 42, 53 that bond the base component 40 and the chip component 50 together. The chip component 50 is, for example, a semiconductor chip that forms a semiconductor.

The base component 40 is a silicone (Si) substrate. Multiple electrodes 41 are embedded in the base component 40. Multiple electrodes 51 are disposed on the lower surface of the chip component 50 and protrude from the lower surface for a predetermined length. The multiple electrodes 51 are arranged to correspond to the respective electrodes 41 disposed on the base component 40.

A liquid resin similar to the liquid resin 11a in the first embodiment is applied between the electrodes 51 such that the distal surfaces of the electrodes 51 and the surface of the liquid resin are in the same plane. By applying the liquid resin between the electrodes 51 of the chip component 50, the surface of the liquid resin becomes smooth as a result of surface tension of the liquid resin. This smooth surface is in the same plane as the distal surfaces of the electrodes 51. The resin layer 52 is formed by curing the liquid resin in this state.

The metal thin film 53 similar to the metal thin film 12 in the first embodiment is formed on the distal surfaces of the electrodes 51 of the chip component 50 and the surface of the resin layer 52. Similarly, a metal thin film 42 similar to the metal thin film 12 in the first embodiment is fonned on the surface of the substrate base component 40. The chip component 50 and the substrate base component 40 are bonded and the semiconductor assembly 4 is fonned by placing the electrodes 51 of the chip component 50 and the electrodes 41 of the substrate base component 40 to oppose each other, and bonding the metal thin films 42, 53 using the atomic diffusion.

As described above, the area where the metal thin film 53 is formed is enlarged by forming the resin layer 52 between the electrodes 51 of the chip component 50 so that the chip component 50 and the base component 40 can be more tightly bonded using the atomic diffusion.

Although two base components are bonded using the atomic diffusion in the above respective embodiments, the present disclosure is not limited to these embodiments. For example, a structure may be formed by stacking multiple semiconductor chips (intermediate chip components, and outermost chip components sandwiching the intermediate chip components), and bonding the chip components using atomic diffusion. Each intermediate chip component may be formed by applying a liquid resin to both the front and back surfaces of a semiconductor chip, curing the liquid resin to form resin layers on both surfaces, and forming metal thin films on the resin layers. Each of the outermost chip components may be formed by applying a liquid resin to a front or back surface of a semiconductor chip and curing the liquid resin to form a resin layer on one of the surfaces, and forming a metal thin layer thereon.

The invention claimed is:

1. A manufacturing method of a structure in which a plurality of elements are bonded, the manufacturing method comprising:
    applying a liquid resin to a surface of at least one of the plurality of elements;
    smoothing a surface of the liquid resin by surface tension of the applied liquid resin;
    forming a resin layer by curing the liquid resin, wherein a surface of the resin layer is smoothed;
    forming a metal thin film on the smoothed surface of the resin layer, wherein the resin layer is sandwiched between the metal thin film and at least one of the plurality of elements;
    forming another metal thin film on a surface of another element; and
    superposing the metal thin film of the at least one element and the metal thin film of the other element, and tightly attaching and bonding the metal thin film of the at least one element and the metal thin film of the other element by deformation of the resin layer.

2. The manufacturing method of the structure according to claim 1, wherein
    the resin layer has elasticity.

3. The manufacturing method of the structure according to claim 2, wherein
    the plurality of elements are semiconductors.

4. The manufacturing method of the structure according to claim 3, wherein
    at least one of the semiconductors comprises a plurality of electrodes protruding from a surface of the at least one semiconductor for a predetermined length; and
    the liquid resin is applied between the plurality of electrodes, and the surface of the liquid resin is smoothed by surface tension of the liquid resin such that distal end surfaces of the plurality of electrodes and the surface of the liquid resin are in the same plane.

5. The manufacturing method of the structure according to claim 3, wherein
    the plurality of elements are semiconductor chips that form semiconductors,
    the liquid resin is applied to a front surface and/or a back surface of each of the semiconductor chips, and the applied liquid resin is smoothed to have a surface roughness lower than that of the other element.

6. The manufacturing method of the structure according to claim 1, wherein
the plurality of elements are semiconductors.

7. The manufacturing method of the structure according to claim 6, wherein
at least one of the semiconductors comprises a plurality of electrodes protruding from a surface of the at least one semiconductor for a predetermined length; and
the liquid resin is applied between the plurality of electrodes, and the surface of the liquid resin is smoothed by surface tension of the liquid resin such that distal end surfaces of the plurality of electrodes and the surface of the liquid resin are in the same plane.

8. The manufacturing method of the structure according to claim 6, wherein
the plurality of elements are semiconductor chips that form semiconductors,
the liquid resin is applied to a front surface and/or a back surface of each of the semiconductor chips, and
the applied liquid resin is smoothed to have a surface roughness lower than that of the other element.

9. The manufacturing method of the structure according to claim 1, wherein
the metal thin film of the at least one element is bonded to the metal thin film of the other element using atomic diffusion.

10. A manufacturing method of a structure in which a plurality of elements are bonded, the manufacturing method comprising:
applying a liquid resin to surfaces of the plurality of elements;
smoothing surfaces of the liquid resin using surface tension of the applied liquid resin;
foaming resin layers by curing the liquid resin, wherein a surface of each of the resin layers is smoothed;
forming a metal thin film on the smoothed surface of each of the resin layers, wherein each of the resin layers is sandwiched between the metal thin film and each of the plurality of elements; and
superposing the metal thin films of the plurality of elements to one another, and tightly attaching and bonding the metal thin films to each other by deformation of the resin layer.

11. The manufacturing method of the structure according to claim 10, wherein
the resin layers have elasticity.

12. The manufacturing method of the structure according to claim 11, wherein
the plurality of elements are semiconductors.

13. The manufacturing method of the structure according to claim 12, wherein
at least one of the semiconductors comprises a plurality of electrodes protruding from a surface of the at least one semiconductor for a predetermined length; and
the liquid resin is applied between the plurality of electrodes, and the surface of the liquid resin is smoothed by surface tension of the liquid resin such that distal end surfaces of the plurality of electrodes and the surface of the liquid resin are in the same plane.

14. The manufacturing method of the structure according to claim 12, wherein
the plurality of elements are semiconductor chips that form semiconductors,
the liquid resin is applied to a front surface and/or a back surface of each of the semiconductor chips, and
the applied liquid resin is smoothed to have a surface roughness lower than that of the plurality of elements.

15. The manufacturing method of the structure according to claim 10, wherein
the plurality of elements are semiconductors.

16. The manufacturing method of the structure according to claim 15, wherein
at least one of the semiconductors comprises a plurality of electrodes protruding from a surface of the at least one semiconductor for a predetermined length; and
the liquid resin is applied between the plurality of electrodes, and the surface of the liquid resin is smoothed by surface tension of the liquid resin such that distal end surfaces of the plurality of electrodes and the surface of the liquid resin are in the same plane.

17. The manufacturing method of the structure according to claim 15, wherein
the plurality of elements are semiconductor chips that form semiconductors,
the liquid resin is applied to a front surface and/or a back surface of each of the semiconductor chips, and
the applied liquid resin is smoothed to have a surface roughness lower than that of the plurality of elements.

18. The manufacturing method of the structure according to claim 10, wherein
the metal thin film of at least one of the plurality of elements is bonded to the metal thin film of another element using atomic diffusion.

* * * * *